United States Patent
Kropfitsch et al.

(10) Patent No.: US 8,610,497 B2
(45) Date of Patent: Dec. 17, 2013

(54) SYSTEM AND METHOD FOR CAPACITIVE SIGNAL SOURCE AMPLIFIER

(75) Inventors: Michael Kropfitsch, Koettmannsdorf (AT); Jose Luis Ceballos, Villach (AT)

(73) Assignee: Infineon Technologies AG, Neubiberg (DE)

( * ) Notice: Subject to any disclaimer, the term of this patent is extended or adjusted under 35 U.S.C. 154(b) by 42 days.

(21) Appl. No.: 13/183,193

(22) Filed: Jul. 14, 2011

(65) Prior Publication Data

US 2013/0015919 A1  Jan. 17, 2013

(51) Int. Cl.
*H03F 3/52* (2006.01)

(52) U.S. Cl.
USPC ............................................. 330/109

(58) Field of Classification Search
USPC .................................. 330/109; 381/122
See application file for complete search history.

(56) References Cited

U.S. PATENT DOCUMENTS

| 5,399,989 | A | 3/1995 | Chern | |
|---|---|---|---|---|
| 2003/0155966 | A1 | 8/2003 | Harrison | |
| 2006/0083392 | A1* | 4/2006 | Akino | 381/122 |
| 2011/0142261 | A1 | 6/2011 | Josefsson | |
| 2011/0150243 | A1* | 6/2011 | Onishi | 381/111 |

FOREIGN PATENT DOCUMENTS

WO  WO-2009/135815 A1  11/2009

OTHER PUBLICATIONS

Harrison, R. R., et al., "A Low-Power Low Noise CMOS Amplifier for Neural Recording Applications," IEEE Journal of Solid-State Circuits, Jun. 2003, pp. 958-965, vol. 38, No. 6.

Vittoz, E., et al., "CMOS analog Integrated Circuits Based on Weak Inversion Operation," IEEE Journal of Solid-State Circuits, Jun. 1977, pp. 224-231.

Harrison, R.R., "Integrated Circuits for Neural Interfacing," Circuits for Emerging Technologies, Feb. 15, 2008, pp. 1-12.

Feng, P., et al., "History of the High-Voltage Charge Pump," Book Excerpt, Nov. 2006, pp. 1-9, Chapter 1, Professional Engineering 6X9, Charge Pump Circuit Design.

* cited by examiner

*Primary Examiner* — Robert Pascal
*Assistant Examiner* — Khiem Nguyen
(74) *Attorney, Agent, or Firm* — Slater & Matsil, L.L.P.

(57) ABSTRACT

According to an embodiment, a system for amplifying a signal provided by a capacitive signal source includes a first stage and a second stage. The first stage has a voltage follower device including an input terminal configured to be coupled to a first terminal of the capacitive signal source, and a first capacitor having a first end coupled to an output terminal of the voltage follower device, and a second end configured to be coupled to a second terminal of the capacitive signal source. The second stage includes a differential amplifier capacitively coupled to the output terminal of the voltage follower device.

27 Claims, 7 Drawing Sheets

Prior Art

SYSTEM AND METHOD FOR CAPACITIVE SIGNAL SOURCE AMPLIFIER

TECHNICAL FIELD

This invention relates generally to semiconductor circuits and methods, and more particularly to an amplifier for a capacitive signal source.

BACKGROUND

Audio microphones are commonly used in a variety of consumer applications such as cellular telephones, digital audio recorders, personal computers and teleconferencing systems. In particular, lower-cost electret condenser microphones (ECM) are used in mass produced cost sensitive applications. An ECM microphone typically includes a film of electret material that is mounted in a small package having a sound port and electrical output terminals. The electret material is adhered to a diaphragm or makes up the diaphragm itself. Most ECM microphones also include a preamplifier that can be interfaced to an audio front-end amplifier within a target application such as a cell phone. The output of the front-end amplifier can be coupled to further analog circuitry or to an A/D converter for digital processing. Because an ECM microphone is made out of discrete parts, the manufacturing process involves multiple steps within a complex manufacturing process. Consequently, a high yielding, low-cost ECM microphone that produces a high level of sound quality is difficult to achieve.

In a microelectro-mechanical Systems (MEMS) microphone, a pressure sensitive diaphragm is etched directly onto an integrated circuit. As such, the microphone is contained on a single integrated circuit rather than being fabricated from individual discrete parts. The monolithic nature of the MEMS microphone produces a higher yielding, lower cost microphone.

The interfacing of a MEMS microphone or sensor with an electrical system, however, poses a number of difficulties because of the microphone's very high output impedance. For example, loading by the preamplifier can potentially attenuate the microphone's output signal, and the high resistance nature of the MEMS microphone makes it prone to EMI disturbance and power supply disturbances due to a poor power supply rejection ratio (PSRR).

SUMMARY OF THE INVENTION

According to an embodiment, a system for amplifying a signal provided by a capacitive signal source includes a first stage and a second stage. The first stage has a voltage follower device including an input terminal configured to be coupled to a first terminal of the capacitive signal source, and a first capacitor having a first end coupled to an output terminal of the voltage follower device, and a second end configured to be coupled to a second terminal of the capacitive signal source. The second stage includes a differential amplifier capacitively coupled to the output terminal of the voltage follower device.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely an amplifier for a capacitive signal source such as a MEMS or an electret condenser microphone (ECM). The invention may also be applied, however, to other types of circuits and systems, such as audio systems, communication systems, sensor systems and other systems that interface to high impedance signal sources.

In an embodiment, an amplifier for a MEMS microphone has a first stage that includes a capacitively coupled gain boosted source follower stage. This first stage provides a high-impedance interface to the MEMS device and a lowered output impedance at an output of the source follower stage. In addition, the amplifier has a second stage including a capacitively coupled differential amplifier that is coupled to the output of the gain boosted source follower stage. By using a very high resistance biasing network, an amplifier having a bandwidth that spans from a few mHz to tens of KHz and above can be achieved, thereby making embodiments suitable for low frequency sensor and audio applications. It should be appreciated that while some of the described embodiments are directed toward MEMS microphone systems, embodiments of the present invention can also be directed toward MEMS sensors, capacitive sensors, and other capacitive and high impedance signal sources.

Figure 1:
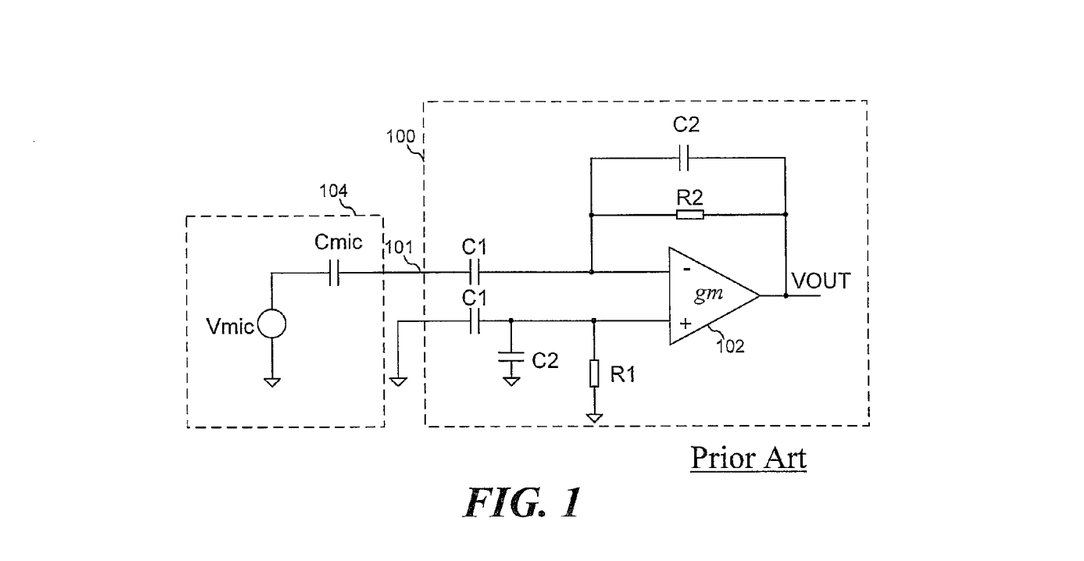
FIG. 1 illustrates an amplifier according to the prior art.

FIG. 1 illustrates capacitive sensor amplifier 100 according to the prior art that interfaces with capacitive source 104. Capacitive source 104, which can be a MEMS microphone, an ECM microphone, or other type of capacitive signal source, is represented by voltage source Vmic coupled in series with capacitor Cmic, which typically has a capacitance between about 1 pF and about 10 pF. The in-band gain of amplifier 100 is about Am=C1/C2. The transfer characteristic of amplifier 100 has a lower corner frequency at about $1/(2*pi*C2*R2)$ and an upper corner frequency at about Gm/

(2*pi*C1*Am). The value of C1 is generally much smaller then sensor capacitance Cmic to minimize signal attenuation.

The noise of amplifier 100 is dominated by the noise of resistors R1 and R2 at low frequencies, and by the noise of transconductance amplifier 102 at higher frequencies. At higher frequencies the output noise of the amplifier 100 is about Vnia*(C1+C2+Cmic)/C2, where Vnia is the input referred noise of transconductance amplifier 102. It can be seen that large values of C2 yield a better noise performance. However, the value of C2 is practically limited because C1 needs to be large enough in relation to C2 to achieve a high voltage gain, but cannot be too large in order to avoid attenuating the input signal 101 due to capacitance division between Cmic and C1.

Figure 2A:
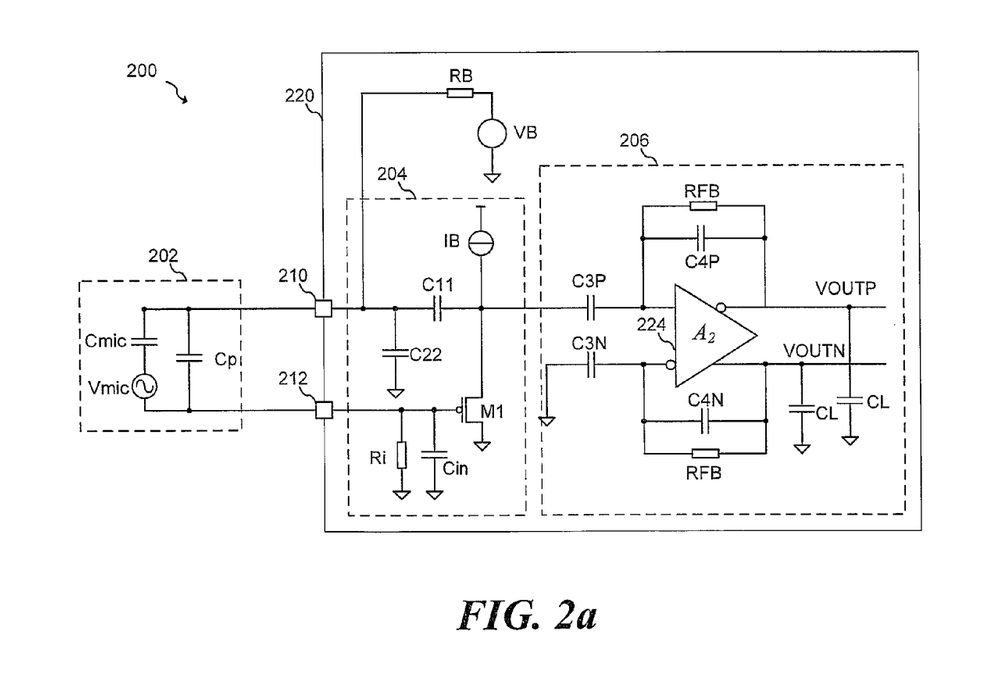
FIGS. 2a-2b illustrate an amplifier according to an embodiment of the present invention.

FIG. 2a illustrates amplification system 200 according to an embodiment of the present invention. MEMS device 202 is coupled to first stage amplifier 204, which is further coupled to second stage 206. First stage amplifier 204 has gain boosted source follower circuit based on transistor M1 and capacitors C11 and C22, and second stage amplifier 206 has a fully differential amplifier 224 in a capacitive feedback configuration. MEMS device 202 is modeled by voltage source Vmic, microphone capacitance Cmic, and parasitic capacitance Cp. In an embodiment, MEMS device 202 is biased by voltage source VB in series with resistance RB, which has a resistance in the GΩ region. Resistance RB and capacitor C2 form a lowpass filter that filters noise coming from voltage source VB. Alternatively, lower resistance values can be used for RB depending on the particular system and its specifications.

In an embodiment, bias devices VB, RB, first stage 204 and second stage 206 are disposed on a same integrated circuit (IC) 220, and MEMS microphone 202 is interfaced to IC 220 via connection pads 210 and 212. Alternatively, MEMS microphone 202 may also be disposed on the same IC 220 as first stage 204 and second stage 206, in which case the terminals of MEMS microphone 202 may be coupled to first stage 204 and bias resistor RB internally.

In an embodiment, one terminal of MEMS microphone 202 is coupled to the gate of transistor M1, and the other terminal is coupled to capacitors C1 and C2 and resistance RB. The combination of transistor M1 and capacitors C11 and C22 form a gain boosted source follower circuit. In embodiments, M1 is configured as a source follower or voltage follower device in which a signal at the gate of transistor M1 is buffered at the source of transistor M1. Because there is minimal phase shift between the gate of transistor M1 and the source of transistor M1, transistor M1 has a boosting effect on voltage Vmic. In an embodiment, the gain of the first stage 204 with respect to Vmic is about G1=1+C11/C22 neglecting the effect of Cmic, parasitic capacitance Cp, the transconductance of M1, and other parasitic components. In an embodiment, G1 is set to be between about 0 dB and about 20 dB. Alternatively, other values for G1 can be used depending on the particular system and its specifications.

In an embodiment, M1 is biased in the subthreshold region via current source IB in order to reduce thermal and flicker noise. Furthermore, device M1 is sized with a large area in order to further reduce flicker noise.

Figure 2B:
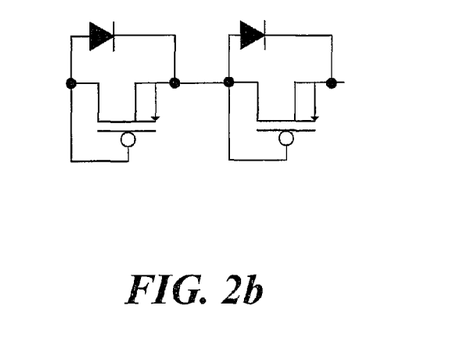

In an embodiment, second stage 206 contains differential amplifier 224 with capacitors C3P, C3N, C4P and C4N forming a capacitive feedback network. The voltage gain of second stage 206 is about C3/C4. In an embodiment, the gain of second stage 206 is set to be between about 0 dB and about 20 dB; however, gains outside of this range can also be used. High resistance feedback resistors RFB are used to bias the input of amplifier 224. In some embodiments, resistors RFB are in the GΩ range. Alternatively, lower resistance values can be used depending on the particular application and its specifications. In one embodiment, resistors RFB are implemented using diode connected MOS coupled in series, as shown in FIG. 2b. By using diode connected transistors, if the input bias voltages of amplifier 224 in FIG. 2a begin to drift, the diode connected transistors will conduct, thereby allowing a temporary DC feedback path to keep the input of amplifier 224 at a proper bias.

In an embodiment, amplifier 224 is implemented as a fully differential operational transconductance amplifier (OTA) with common mode feedback, however, other amplifier architectures, including, but not limited to a symmetrical amplifier, a folded cascode amplifier, an instrumentation amplifier, and a Miller amplifier can be used in alternative embodiments.

In an embodiment, the influence of the capacitor size Cmic in relation to capacitors present within the amplifier circuit is strongly reduced because of the lower capacitive load realized by driving the opposite end of C11 at the output of first stage 204 in phase with the input signal across terminals 210 and 212. A second low frequency corner of the frequency characteristic is introduced, which is defined by the input capacitance Cin of source follower transistor M1 and an additional input resistance Ri that models the biasing network at the gate of M1. In an embodiment, Ri is between about 10 GΩ and about 1 TΩ. Alternatively, Ri can also be outside of this range. In some embodiments, the implementation depicted in FIG. 2a can achieve good noise performance with small sensor capacitor values.

In one embodiment, the value of Cmic is about 5.5 pF, the gain of first stage amplifier 204 is about 1, the gain of second stage amplifier 206 is about 5, the 3 dB lower corner frequency is about 20 Hz, and the 3 dB upper corner frequency is about 20 kHz. Here, output load capacitors CL limit the bandwidth of the amplifier 224 and may act as an anti-aliasing filter for systems having an A/D converter interfaced to the output of second stage 206. In alternative embodiments, the upper corner frequency can be much higher, for example 200 kHz, for higher bandwidth systems, or for systems not requiring filtering.

In an embodiment, the thermal noise of second stage 206 can be reduced by increasing C22 and C11. Because second stage 206 is buffered by first stage 204, an increase in capacitors C11 and C22 does not directly load the outputs of MEMS microphone 202. In some embodiments, the circuit can be configured such that first stage 204 realizes a maximum gain, for example, 6 dB, and second stage 206 is used for signal mode conversion, for example converting a single ended signal to a differential signal. Second stage 206 may also be used for the adaption of sensitivity, since first stage 204 may not be able to provide 30 dB alone.

Figure 3:
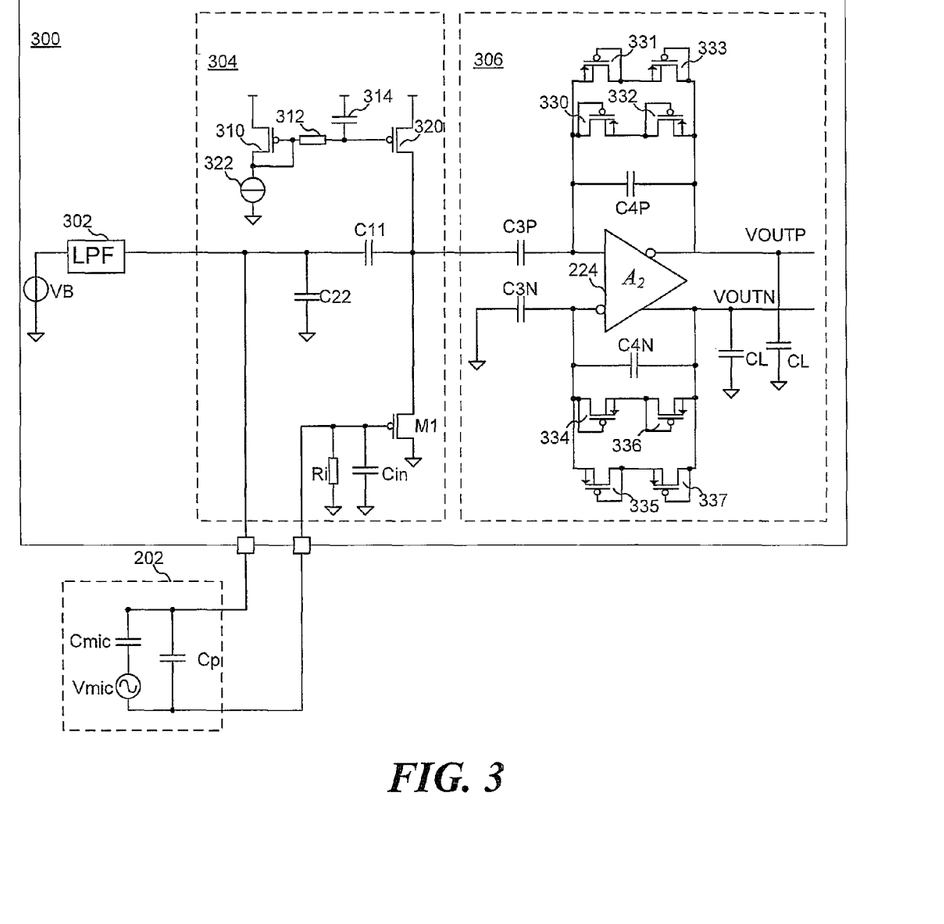
FIG. 3 illustrates an amplifier according to an alternative embodiment of the present invention.

Turning to FIG. 3, amplification system 300 is illustrated according to a further embodiment of the present invention. MEMS microphone 202 is coupled to first stage 304, which is similar to first stage 204 in FIG. 2a. Here, boosted source follower transistor M1 is biased by PMOS transistor 320, which mirrors current form current source 322 through transistor 310. A lowpass filter is formed by resistor 312 and capacitor 314 to filter the bias voltage at the gate of transistor 320. In an embodiment, the corner frequency formed by this lowpass filter may range from about 1 mHz to about 1 Hz; however, in alternative embodiments other corner frequencies can be used.

In second stage 306, the negative input of amplifier 224 is biased by diode connected PMOS devices 330, 331, 332 and 333, and the positive input of amplifier 224 is biased by diode connected PMOS devices 334, 335, 336 and 337. In alternative embodiments, greater or fewer diode connected devices may be coupled in series depending on the nominal expected signal swing of node voltages within second stage 306. Furthermore, other device types besides PMOS devices, for example, triple well NMOS devices, in which the bulk nodes are not coupled to the substrate by default can be used for the feedback bias resistances.

In an embodiment, MEMS device 202 is biased by voltage source VB followed by low pass filter 302, which nominally has a corner frequency of between 1 mHz and about 1 Hz. Bias voltage VB may be between about 3V and about 60V, although voltages outside of this range are also possible depending on the particular MEMS microphone and/or capacitive sensor used.

Figure 4:
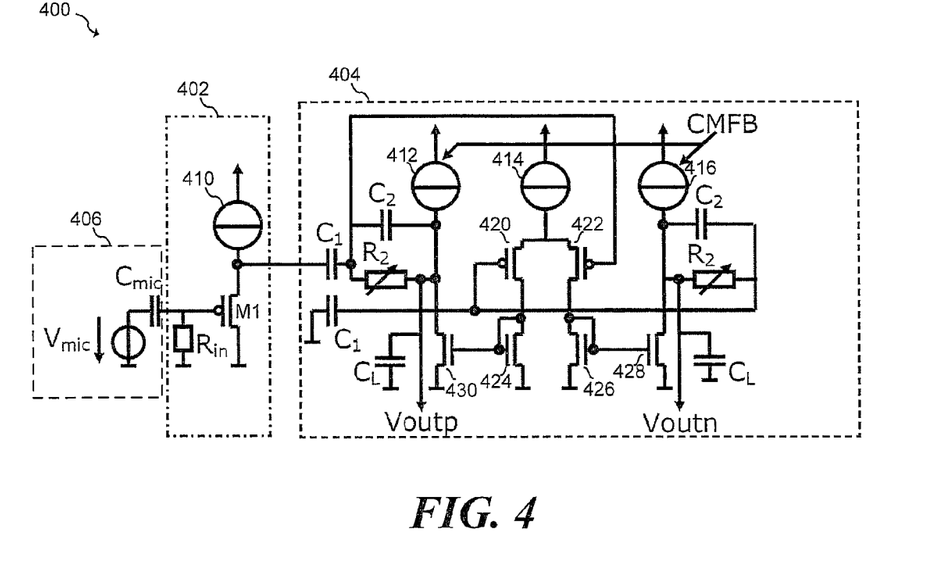
FIG. 4 illustrates an amplifier according to a further alternative embodiment of the present invention.

FIG. 4 illustrates embodiment amplification system 400 that is suitable for amplifying the output of an ECM microphone that has one terminal coupled to first stage 402. Furthermore, in embodiments using ECM microphones, a microphone bias voltage is not necessary. It should be appreciated that ECM microphones may also be used in other embodiments, such as the embodiment illustrated in FIG. 3 Microphone 406, which is represented by Vmic and internal capacitance Cmic, is coupled to first stage 402. First stage 402 has a source follower PMOS device M1 biased by current source 410. PMOS device M1 is preferably biased in the subthreshold region for better noise performance. In alternative embodiments, a source follower transistor of another transistor type, for example, a NMOS type can be used. Furthermore, in other embodiments, source follower device M1 may be biased in the saturation region.

In an embodiment, second stage 404 is implemented using a transconductance amplifier having an input differential pair made of PMOS transistors 420 and 422, which are biased by current source 414. The drain currents of transistors 420 and 422 are mirrored to NMOS devices 430 and 428, respectively, via diode connected NMOS devices 424 and 426. Alternatively, the device types of second stage 404 may be inverted. For example, transistors 420 and 422 can be implemented by NMOS devices and/or transistors 430, 424, 426 and 428 can be implemented by PMOS devices or different combinations of NMOS and PMOS devices thereof. Current sources 412 and 416, which supply current to 430 and 428, are controlled by common mode feedback (CMFB) that sets the common mode voltage of output nodes Voutp and Voutn to a predefined voltage and/or range of voltages. Input transistors 420 and 422 are biased via bias resistors R2, which define the input DC voltage levels for transistors 420 and 422. In some embodiments, bias resistors R2 are variable resistors that are implemented using diode connected transistors, such as those illustrated in FIG. 2b. In an embodiment, the gain of second stage 404 is approximately C1/C2, and output corner frequency is set by the value of output load capacitance CL and the transconductance of amplifier 404.

In an embodiment, first stage 402 has a voltage gain about one, and the second stage is set to have a voltage gain of about 5, and ECM microphone 406 has a capacitance Cmic of about 5.5 pF. In an embodiment, first stage 402 has a high-pass characteristic and second stage 404 has a bandpass characteristic. The composite 3 dB bandwidth of first stage 402 cascaded with second stage 404 spans from about 20 Hz to about 20 kHz. It should be appreciated that these values are just an example of one embodiment, and that the gains, bandwidths and capacitances of alternative embodiments may be different.

Figure 5:
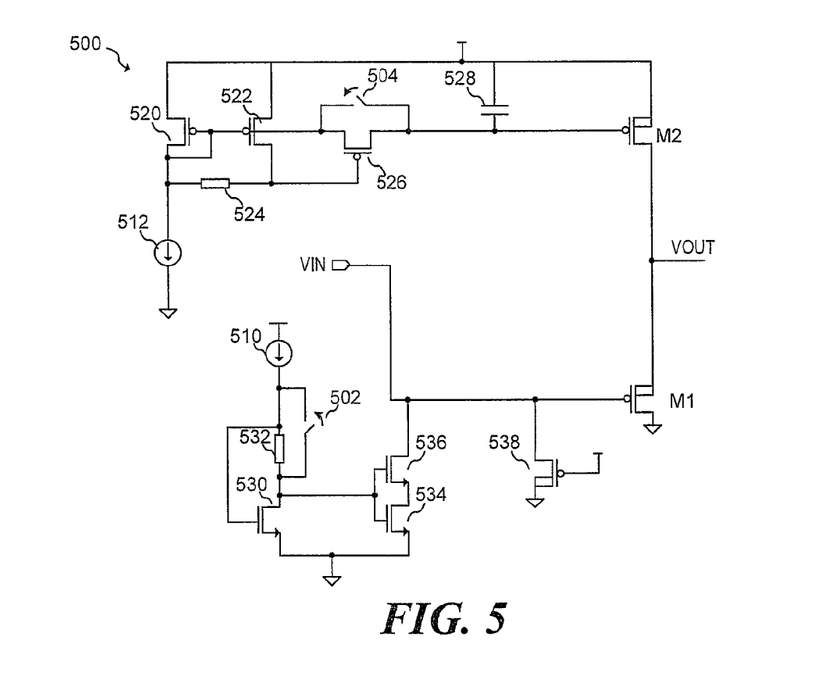
FIG. 5 illustrates an embodiment first stage amplifier.

FIG. 5 illustrates an embodiment of first stage amplifier 500 along with its associated bias circuitry. In embodiments, first stage amplifier 500 may be used as a first stage for the embodiments illustrated in FIGS. 2a, 3 and 4. PMOS source follower device M1 is biased to ground potential via NMOS transistors 534 and 536. In an embodiment, transistors 534 and 536 have a long transistor length to increase the output impedance. These two transistors realize the input biasing resistor for transistor M1. By coupling the gate of device 530 to its drain via resistor 532, the VGS for transistors 534 and 536 is reduced by resistor 532. Due to this construction, the VGS of 534 and 536 is in the mV region, the transistor is in very weak inversion and the output impedance of 536 and 534 is in the TΩ to 100 GΩ region. It should be appreciated, however the transistors 536 and 534 are not completely shut off. In one embodiment, resistor 532 is between about 300KΩ and about 500KΩ, and the current of current source is 510 is between about 400 nA and about 5 uA. In alternative embodiments, other component values, current levels and corner frequencies can be implemented. PMOS device 538 is provided for ESD protection and will conduct current, for example, if input voltage VIN increases above VDD. Alternatively, other ESD protection schemes known in the art may be used depending on the particular application and its specifications.

In an embodiment, the current of current source 512 is mirrored to PMOS device M2 via PMOS device 520. The voltage at the gate of device 520 is lowpass filtered by and RC lowpass filter network formed by the resistance of PMOS device 526 and the capacitance of capacitor 528. In an embodiment, the corner frequency of this RC lowpass network is about 100 mHz. PMOS device 526 is biased in the linear region by PMOS device 522 and resistor 524. In an embodiment, optional switches 502 and 504 are closed during startup in order to allow node voltages to settle quickly to their quiescent values prior to operation of the amplifier. Bypassing these resistances avoids a long startup time due to the long time constants. These switches can be closed, for example during the first 100 ms or 200 ms of operation, however durations outside of this range is also possible. After the switches are opened, the biasing nodes have a high time constant. Switches 502 and 504 can be omitted in situations were startup time is not an issue and/or in circuits having smaller time constants.

Figure 6:
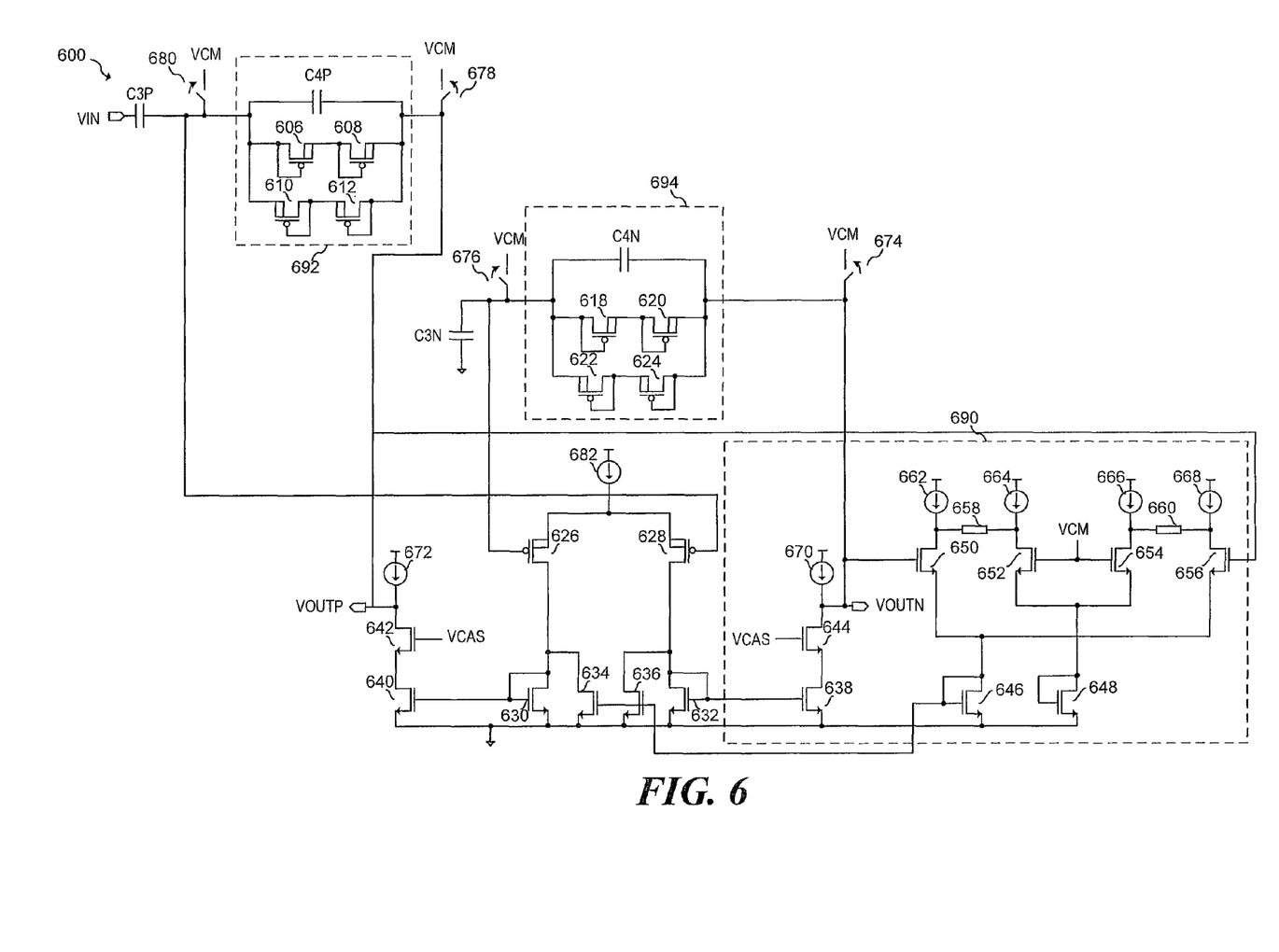
FIG. 6 illustrates an embodiment second stage amplifier; C-A1

FIG. 6 illustrates a circuit level schematic of second stage amplifier 600 according to an embodiment of the present invention. In embodiments, second stage amplifier 600 may be used as a second stage for the embodiments illustrated in FIGS. 2a, 3 and 4. A fully differential cascoded amplifier has PMOS differential pair made of devices 626 and 628 biased by current source 682. Current from these devices are mirrored to NMOS devices 640 and 638 via diode connected NMOS devices 630 and 632, respectively. High impedance is achieved at output nodes VOUTP and VOUTN by optional cascode transistors 642 and 644 with NMOS devices 642 and 644, respectively. The gate bias voltage of transistors 642 and 644 is represented by voltage VCAS, which can be generated using cascode bias techniques known in the art. In an embodiments, current sources 672 and 670 can also be implemented using cascoded current sources, however, other current source structures known in the art can also be used depending on the particular application and the available headroom.

In an embodiment, the common mode output level of nodes VOUTP and VOUTN are set to voltage VCM using common mode feedback circuit 690. Voltage VCM can be generated, for example, by using voltage generation techniques known in the art, for example, using a bandgap voltage reference or a resistive voltage divider between the power supply and ground. Common mode feedback circuit 690 has NMOS device 652 and 654 coupled to VCM and NMOS devices 650 and 656 coupled to VOUTN and VOUTP, respectively. Current supplied by current sources 662, 664, 666 and 668 are steered among diode connected NMOS devices 646 and 648 via resistors 658 and 660 and via NMOS devices 650, 652, 654 and 656. Current though NMOS device 646 is conducted from the drains of PMOS devices 626 and 628 via NMOS devices 634 and 636, respectively, thereby forming a closed common mode loop. It should be appreciated that other common mode biasing schemes known in the art can also be applied to embodiment second stages.

In an embodiment, feedback is provided between outputs VOUTP and VOUTN and the gates of PMOS devices 628 and 626. For example, feedback network 692 has capacitor C4P and diode connected PMOS devices 606 and 608 oriented in a first direction and PMOS devices 610 and 612 oriented in a second direction. Capacitor C4P can be implemented using, for example, poly-poly capacitors, MIM capacitors, and gate capacitors depending on required circuit density and signal linearity.

In an embodiment, diode connected transistors 606, 608, 610 and 612, which provide a DC bias to the gates of PMOS devices 626 and 628, are oriented in two directions to prevent both positive and negative transients from disturbing the bias point of the amplifier for long periods of time. In some embodiments, greater or less than two diode connected transistors can be connected in series. Embodiments having more transistors coupled in series have a high linear region of amplifier operation and lower total harmonic distortion (THD) at the expense of slower and more difficult recovery form transient disturbances. In embodiments, the number of series biasing devices is selected according to the particular application and its specifications. Feedback network 694, which has capacitor C4N and PMOS device 618, 620, 622 and 624 operates according to the principles of feedback network 692 described above. In an embodiment, optional switches 676, 674, 678 and 680 coupled the inputs and outputs of feedback networks 692 and 694 are closed during startup in order to more quickly bias the amplifier.

In embodiments, the voltage gain of second stage 600 is approximately C3P/(C4P). Furthermore, in some embodiments, capacitors C4P, and C4N are made to match each other, and capacitors C3P and C3N are made to match each other by using techniques known in the art in order to enhance the power supply rejection ratio (PSRR) and offset of the amplifier. These techniques can include, for example, using unit devices and common centroid layout techniques. PSRR and offset performance can be further enhanced using known layout and sizing techniques to match the remaining active and passive devices within circuit 600.

Figure 7A:
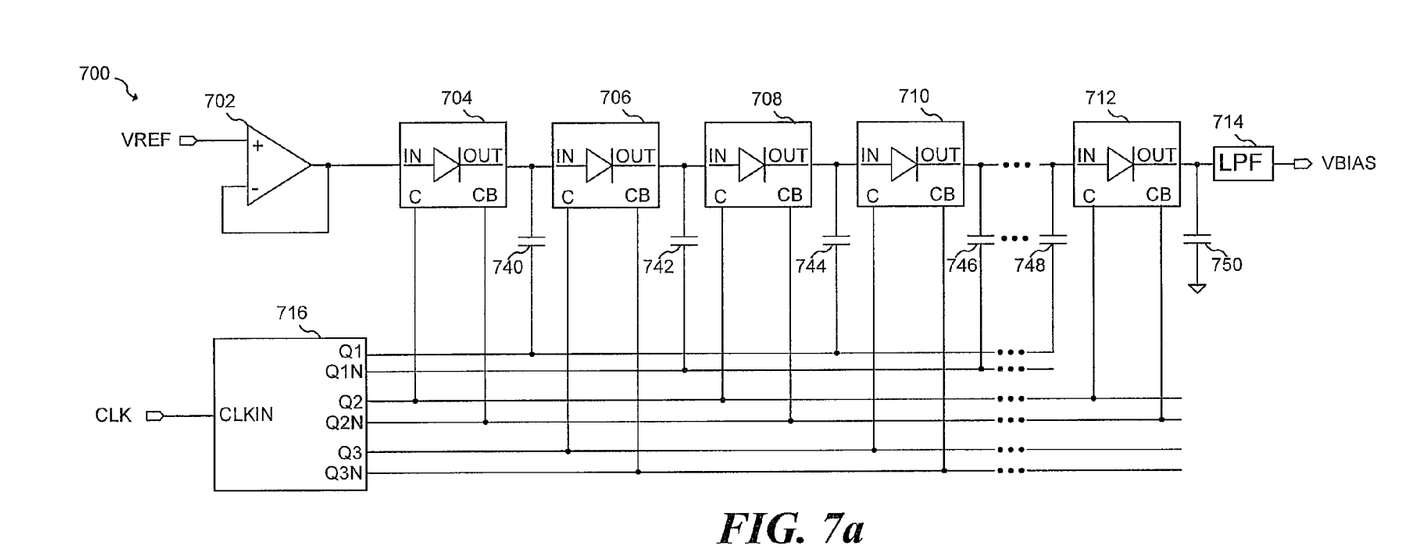
FIGS. 7a, 7b, 7c and 7d illustrate schematics and a timing diagram of an embodiment MEMS microphone bias circuit.

FIGS. 7a-7d illustrate an embodiment bias circuit that may be used to implement voltage source VB shown in FIGS. 2a and 3. FIG. 7a illustrates a top level schematic of MEMS bias circuit 700, which is used to provide a boosted voltage between about 3V and about 60V. Alternatively, voltages outside of this range are also possible depending on the particular MEMS microphone and/or capacitive sensor used. In an embodiment, a Dickson charge pump structure is used to provide boosted output voltage VBIAS. The charge pump is formed by capacitors 740, 742, 744, 746 and 748 coupled to functional diode blocks 704, 706, 708, 710 and 712. In one embodiment, nine functional diode block are used. Alternatively, any number of functional diode blocks may be used depending on the boosted voltage required. In an embodiment, reference voltage VREF is buffered by amplifier 702 and fed into first functional diode 704. Clock generator 716 provides clock signals Q1, Q1N, Q2, Q2N, Q3 and Q3B that drive capacitors 740, 742, 744, 746 and 748 and functional diode blocks 704, 706, 708, 710 and 712. The output of last functional diode block 712 is coupled to capacitor 750 and lowpass filter 750.

Figure 7B:
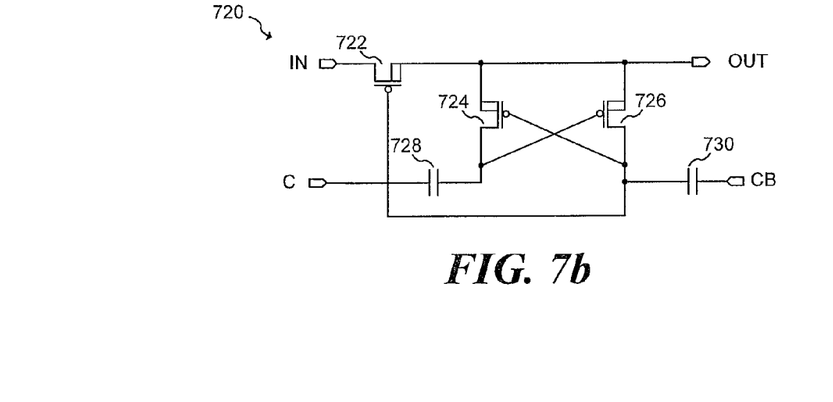

FIG. 7b illustrates embodiment functional diode block 720, which has PMOS devices 722, 724 and 726 and input coupling capacitors 728 and 730. PMOS device 722 is a pass transistor that coupled input IN of functional diode 720 to output OUT of functional diode 720. Cross coupled transistors 724 and 726 and input coupling capacitors 728 730 provides a boosted clock that shuts off transistor 722 at time during which the functional diode is in a non-conducting state. By using circuit 720, inefficiencies due to the threshold voltage of transistor 722 may be avoided. In alternative embodiments, a pn junction diode, a diode connected transistor, or other suitable device may be used in place of functional diode 720.

Figure 7C:
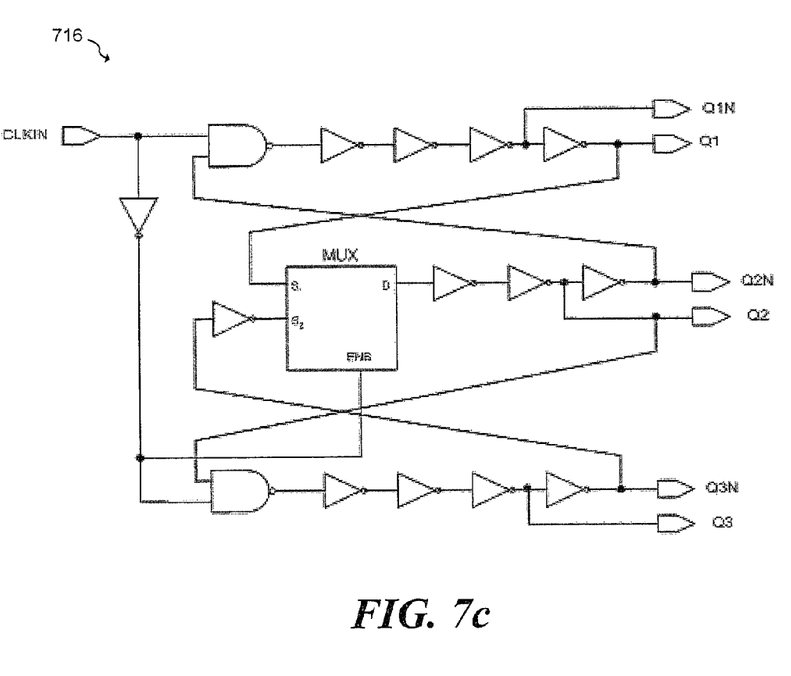
Figure 7D:
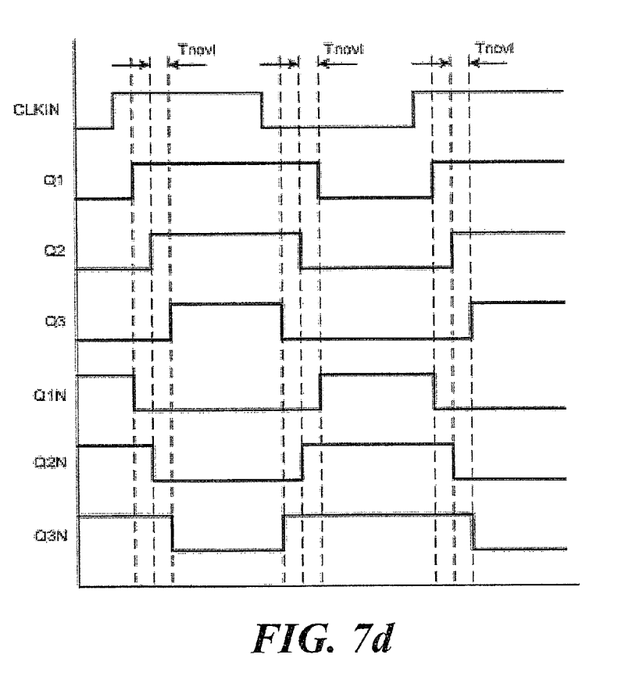

FIG. 7c illustrates a schematic of embodiment clock generator 716, which provides phased clocks for capacitors 740, 740, 742, 744, 746 and 748, and functional diodes 704, 706, 708, 710 and 712. FIG. 7d illustrates a timing diagram of clock generator 716, In an embodiment, clock signals Q1 and Q1N that drive capacitors 740, 740, 742, 744, 746 and 748 have the widest pulse width, clock signals Q2 and Q2N that drive some of the functional diodes have a narrower pulse width, and clock signals Q3 and Q3 that drive the remaining functional diodes have the narrowest pulse width. In an embodiment, the rising edge of Q2 with respect to Q1, the falling edge of Q1 with respect to Q2, the rising edge of Q3 with respect to Q2 and the falling edge of Q2 with respect to Q3 is delayed by Tnovl. By using an embodiment clock phasing scheme, such as the one illustrated in FIG. 7d, functional diodes 704, 706, 708, 710 and 712 are in a stable before the signals driving capacitors 740, 740, 742, 744, 746 and 748 are change state. In alternative embodiments, other clock phase relationships may be used.

Figure 8:
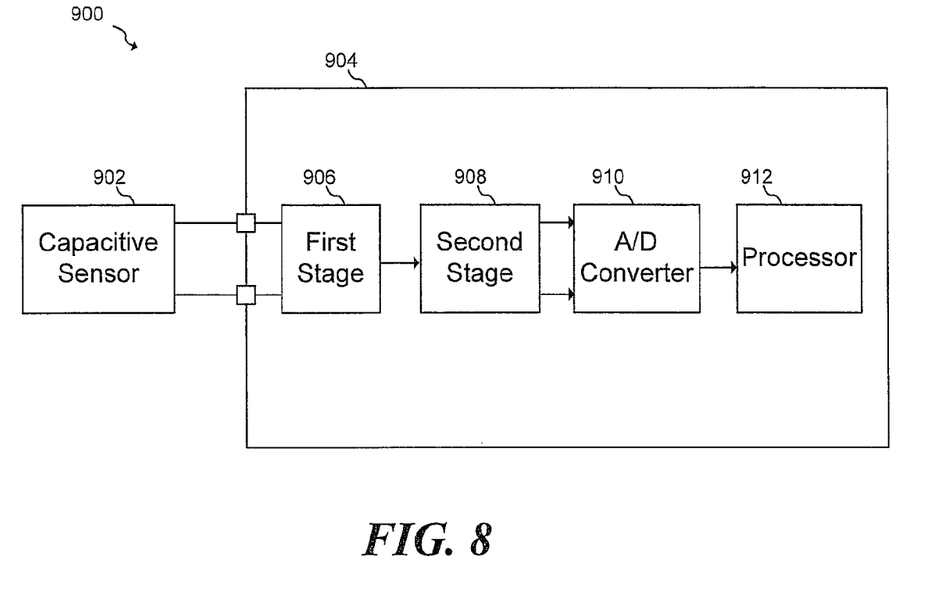
FIG. 8 illustrates a system according to an embodiment of the present invention.

FIG. 8 illustrates system 900 using embodiments of the present invention. Capacitive sensor 902 is coupled to integrated circuit 904 having first stage 906 and second stage 908 according to embodiments of the present invention described herein. In an embodiment, the differential output of second stage 908 is coupled to A/D converter 910. In some embodiments, A/D converter is implemented as an audio sigma-delta converter. In other embodiments, A/D converter can be, for example, a low frequency A/D suitable for sensor applications. In embodiments, the output of A/D converter is coupled to processor 912 to perform a useful function. Examples of possible applications achievable by system 900 include, but are not limited to telephone systems, digital recorders, and remote sensing systems.

In some embodiments, for example, capacitive sensor 902 can be a MEMS microphone or other capacitive sensor such as capacitive pressure sensor, an ECM, or another type of floating capacitive signal source. In alternative embodiments, capacitive sensor 902 can be included on integrated circuit 904. Furthermore, A/D converter 910 and/or processor 912 can be located separately from integrated circuit 904. In some embodiments, the functionality of integrated circuit 904 may be implemented using a single integrated circuit, or using a plurality of integrated circuits.

According to an embodiment, a system for amplifying a signal provided by a capacitive signal source includes a first stage and a second stage. The first stage has a voltage follower device including an input terminal configured to be coupled to a first terminal of the capacitive signal source, and a first capacitor having a first end coupled to an output terminal of the voltage follower device, and a second end configured to be coupled to a second terminal of the capacitive signal source.

The second stage includes a differential amplifier capacitively coupled to the output terminal of the voltage follower device.

In some embodiments, the voltage follower device of the first stage includes a MOS source follower may be biased in the subthreshold region. The first stage may also include a second capacitor comprising a first end coupled to a reference node and a second end configured to be coupled to the second terminal of the capacitive signal source.

In an embodiment, the second stage also includes an input capacitor coupled between the output terminal of the voltage follower device and a first input terminal of the differential amplifier, and a reference capacitor coupled between a reference node and a second input terminal of the differential amplifier. The second stage may also include a first feedback capacitor coupled between a first output terminal of the differential amplifier and the first input terminal of the differential amplifier, and a second feedback capacitor coupled between a second output terminal of the differential amplifier and the second input terminal of the differential amplifier.

In some embodiments, the system may be configured to be coupled to an external capacitive signal source, however, in some embodiments, the capacitive signal source may also be included in the system. In some embodiments, the capacitive signal source resides on the same integrated circuit at the first and second stages. In some embodiments, this capacitive signal source may includes a MEMS or ECM microphone, while in other embodiments the capacitive signal source may include a capacitive sensor or other high impedance signal source.

According to a further embodiment, an amplifier for amplifying a signal provided by a high impedance signal source includes a source follower transistor having a gate configured to be coupled to a first terminal of the high impedance signal source, and a first capacitor having a first terminal coupled to a source of the source follower transistor and a second terminal configured to be coupled to a second terminal of the high impedance signal source. The source follower transistor may be biased in the subthreshold region in some embodiments. A second capacitor is further coupled between the source of the source follower transistor and a first input of a differential amplifier and a third capacitor coupled between a first output of the differential amplifier and the first input of the differential amplifier. The differential amplifier is configured to produce a negative phase at the first output with respect to the first input, and a low-frequency gain of the differential amplifier is set by a ratio of a capacitance of the second capacitor and a capacitance of the third capacitor. In some embodiments, the amplifier further includes a fourth capacitor coupled between the second terminal of the first capacitor and a voltage reference.

In some embodiments, the high impedance signal source is a capacitive signal source such as a MEMS or ECM microphone, and the amplifier may also include a biasing network for the high impedance signal source. For example, a MEMS bias circuit may be provided for an amplifier configured to amplify a MEMS microphone. In some embodiments, the MEMS bias circuit is coupled to the second terminal of the first capacitor.

In an embodiment, a voltage gain from the first and second terminals of the high impedance signal source to the source of the source follower transistor is dependent on a ratio of a capacitance of the first capacitor and a capacitance of the fourth capacitor. This voltage gain may be greater than one in some embodiments.

In an embodiment, the amplifier also includes a fifth capacitor coupled between a second input of the differential amplifier and a reference voltage and a sixth capacitor coupled between a second output of the differential amplifier and the second input of the differential amplifier. This differential amplifier may comprise a fully differential amplifier with common mode feedback. In some embodiments, the differential amplifier comprises an operational transconductance amplifier (OTA).

In an embodiment, a bias resistor coupled in parallel with the third capacitor. The bias resistor may have a value of at least 100 MΩ, however, in alternative embodiments, a lower value may be used depending on the application and its specifications. In an embodiment, the bias resistor comprises is made of diode connected MOS devices connected in series.

According to a further embodiment, an integrated circuit for amplifying a signal provided by a floating capacitive source includes a first stage configured to transform a first higher impedance of the floating capacitive source to a second lower impedance at an output of the first stage. The first stage is further configured to increase an input impedance of the first stage by providing positive feedback from the output of the first stage to an input of the first stage via a first capacitor. The amplifier also includes a second stage for transforming the output of the first stage to a differential signal at an output of the second stage. In some embodiments, the integrated circuit also includes a bias network configured to provide a bias voltage to the floating capacitive source.

In an embodiment, the first stage includes a boosted source follower circuit comprising a voltage gain greater than one and the second stage comprises a differential amplifier capacitively coupled to an output of the boosted source follower circuit. The first stage may further includes a second capacitor coupled between the input of the first stage and a reference node, such that the voltage gain of the boosted source follower circuit is based on a ratio of a capacitance of the first capacitor and a capacitance of the second capacitor.

According to another embodiment, an integrated circuit for amplifying signal produced by a floating capacitive source includes a boosted source follower circuit configured to be coupled to the floating capacitive source. In some embodiments, the boosted source follower circuit has a voltage gain greater than one. The integrated circuit also includes a differential amplifier capacitively coupled to an output of the source follower circuit and a bias network configured to be coupled to at least one terminal of the floating capacitive source. The differential amplifier may be a fully differential amplifier with a gain set by a capacitive feedback network.

In an embodiment, the boosted source follower circuit includes a MOS transistor configured to be coupled to a first terminal of the floating capacitive source, a first capacitor having a first terminal coupled to a source of the MOS transistor and a second terminal configured to be coupled to a second terminal of the floating capacitive source, and a second capacitor coupled between the second terminal of the first capacitor and a reference voltage. In some embodiments, the reference voltage is a ground voltage.

According to a further embodiment, a method of amplifying a signal provided by a capacitive signal source includes receiving a first signal from a first terminal of the capacitive signal source at a control terminal of a voltage follower and receiving a second signal from a second terminal of the capacitive signal source at a first capacitor coupled to an output node of a voltage follower device. A bias voltage may be provided to the capacitive signal source in some embodiments. The method further includes amplifying the first and second signals by applying a voltage gain based on a ratio of the first capacitor and a second capacitor coupled between the second terminal of the capacitive signal source and a reference node. A third signal is received from the output node of the voltage follower device by a capacitively coupled, fully differential amplifier, and the third signal is amplified to produce a differential output signal. In some embodiments, an analog to digital conversion on the differential output signal.

Advantages of embodiments include the ability of the amplifier to handle higher signal swings because of the differential structure of embodiment second stage amplifiers. This embodiment differential structure also suppresses even order harmonics. Furthermore, by using two stages in embodiment amplifiers, the sensitivity to amplifier gain variation is small. In some embodiments, this gain variation may be a maximum of about 0.3 dB. Moreover, the gain of the system can be set based on capacitor ratios, thereby reducing the overall gain variation of the systems. In addition, by decoupling the capacitance of the MEMS device with the input capacitor of the second stage, the output of the MEMS device is not attenuated due to a large input capacitor coupled to a virtual ground. The effect of loading the MEMS device with capacitance is further reduced because the MEMS capacitance is coupled in series with the gate of the follower transistors, which converts the high impedance node of the MEMS to a low impedance node for the second stage. In embodiments, the first stage operates like a voltage source with low impedance and the corresponding voltage swing of the sensor.

A further advantageous aspect of embodiments includes better noise performance. By providing a gain boost at the first stage, the noise contribution of the second stage is reduced.

A further advantage of embodiments includes the ability to suppress EMI disturbances and light related disturbances experienced by the MEMS sensor, as EMI or power supply disturbances seen by the integrated circuit are suppressed by the differential structure of the second stage differential amplifier. With respect to disturbances seen by the MEMS sensor itself, most EMI disturbances will affect the sensor as a common mode signal. These disturbances are suppressed because both terminals of the sensor are coupled to the first stage of the amplifier. Therefore, any in-phase signal seen at both terminals of the MEMS sensor is rejected or significantly attenuated.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system for amplifying a signal provided by a capacitive signal source, the system comprising:
   a first stage comprising:
      a voltage follower device comprising an input terminal configured to be coupled to a first terminal of the capacitive signal source, and
      a first capacitor comprising a first end coupled to an output terminal of the voltage follower device, and a second end configured to be directly connected to a second terminal of the capacitive signal source; and
   a second stage capacitively coupled to the output terminal of the voltage follower device, the second stage comprising a differential amplifier.

2. The system of claim 1, wherein the second stage further comprises:
   an input capacitor coupled between the output terminal of the voltage follower device and a first input terminal of the differential amplifier;
   a reference capacitor coupled between a reference node and a second input terminal of the differential amplifier;
   a first feedback capacitor coupled between a first output terminal of the differential amplifier and the first input terminal of the differential amplifier; and
   a second feedback capacitor coupled between a second output terminal of the differential amplifier and the second input terminal of the differential amplifier.

3. The system of claim 1, wherein the voltage follower device comprises a MOS source follower.

4. The system of claim 3, wherein the source follower device is biased in a sub-threshold region.

5. The system of claim 1, wherein the first stage further comprises a second capacitor comprising a first end coupled to a reference node and a second end configured to be coupled to the second terminal of the capacitive signal source.

6. The system of claim 1, further comprising the capacitive signal source.

7. The system of claim 6, wherein the capacitive signal source comprises a MEMS microphone.

8. An amplifier for amplifying a signal provided by a high impedance signal source, the amplifier comprising:
   a source follower transistor having a gate configured to be coupled to a first terminal of the high impedance signal source;
   a first capacitor having a first terminal coupled to a source of the source follower transistor and a second terminal configured to be directly connected to a second terminal of the high impedance signal source;
   a second capacitor coupled between the source of the source follower transistor and a first input of a differential amplifier; and
   a third capacitor coupled between a first output of the differential amplifier and the first input of the differential amplifier, wherein
      the differential amplifier is configured to produce a negative phase at the first output with respect to the first input, and
      a low-frequency gain of the differential amplifier is set by a ratio of a capacitance of the second capacitor and a capacitance of the third capacitor.

9. The amplifier of claim 8, further comprising a fourth capacitor coupled between the second terminal of the first capacitor and a voltage reference, wherein a voltage gain from the first and second terminals of the high impedance signal source to the source of the source follower transistor is dependent on a ratio of a capacitance of the first capacitor and a capacitance of the fourth capacitor.

10. The amplifier of claim 9, wherein the voltage gain from the first and second terminals of the high impedance signal source to the source of the source follower transistor is greater than one.

11. The amplifier of claim 8, further comprising:
   a fifth capacitor coupled between a second input of the differential amplifier and a reference voltage; and
   a sixth capacitor coupled between a second output of the differential amplifier and the second input of the differential amplifier.

12. The amplifier of claim 8, wherein the differential amplifier comprises a fully differential amplifier with common mode feedback.

13. The amplifier of claim 8, wherein the source follower transistor is biased in a sub-threshold region.

14. The amplifier of claim 8, further comprising a bias resistor coupled in parallel with the third capacitor, the bias resistor comprising a value of at least 100 MΩ.

15. The amplifier of claim 14, wherein the bias resistor comprises a plurality of diode connected MOS devices connected in series.

16. The amplifier of claim 8, wherein the high impedance signal source comprises a capacitive signal source.

17. The amplifier of claim 16, wherein the capacitive signal source comprises a MEMS microphone.

18. The amplifier of claim 17, further comprising a MEMS bias circuit coupled to the second terminal of the first capacitor.

19. The amplifier of claim 8, wherein the differential amplifier comprises an operational transconductance amplifier (OTA).

20. An integrated circuit for amplifying a signal provided by a floating capacitive source, the integrated circuit comprising:
   a first stage configured to transform a first impedance of the floating capacitive source to a second impedance at an output of the first stage, the first impedance being greater than the second impedance, wherein the first stage is configured to increase an input impedance of the first stage by providing positive feedback from the output of the first stage to an input of the first stage via a first capacitor; and
   a second stage for transforming the output of the first stage to a differential signal at an output of the second stage.

21. The integrated circuit of claim 20, further comprising a bias network configured to provide a bias voltage to the floating capacitive source.

22. The integrated circuit of claim 20, wherein the first stage comprises a boosted source follower circuit comprising a voltage gain greater than one.

23. The integrated circuit of claim 22, wherein:
   the first stage further comprises a second capacitor coupled between the input of the first stage and a reference node; and
   the voltage gain is based on a ratio of a capacitance of the first capacitor and a capacitance of the second capacitor.

24. A method of amplifying a signal provided by a capacitive signal source, the method comprising:
   receiving a first signal from a first terminal of the capacitive signal source at a control terminal of a voltage follower;
   receiving a second signal from a second terminal of the capacitive signal source at a first capacitor coupled to an output node of a voltage follower device;
   amplifying the first and second signals, amplifying comprising applying a voltage gain based on a ratio of the first capacitor and a second capacitor coupled between the second terminal of the capacitive signal source and a reference node;
   receiving a third signal from the output node of the voltage follower device by a capacitively coupled, fully differential amplifier; and
   amplifying the third signal, amplifying comprising producing a differential output signal.

25. The method of claim 24, further comprising performing an analog to digital conversion on the differential output signal.

26. The method of claim 24, further comprising providing a bias voltage to the capacitive signal source.

27. An amplifier for amplifying a signal provided by a high impedance signal source, the amplifier comprising:
   a source follower transistor having a gate configured to be coupled to a first terminal of the high impedance signal source;
   a first capacitor having a first terminal coupled to a source of the source follower transistor and a second terminal configured to be coupled to a second terminal of the high impedance signal source;
   a second capacitor coupled between the source of the source follower transistor and a first input of a differential amplifier;
   a third capacitor coupled between a first output of the differential amplifier and the first input of the differential amplifier, wherein
      the differential amplifier is configured to produce a negative phase at the first output with respect to the first input, and
      a low-frequency gain of the differential amplifier is set by a ratio of a capacitance of the second capacitor and a capacitance of the third capacitor; and
   a bias resistor coupled in parallel with the third capacitor, the bias resistor comprising a value of at least 100 MΩ, wherein the bias resistor comprises a plurality of diode connected MOS devices connected in series.

* * * * *

UNITED STATES PATENT AND TRADEMARK OFFICE
CERTIFICATE OF CORRECTION

PATENT NO.         : 8,610,497 B2
APPLICATION NO.    : 13/183193
DATED              : December 17, 2013
INVENTOR(S)        : Michael Kropfitsch It is certified that error appears in the above-identified patent and that said Letters Patent is hereby corrected as shown below:

On the Title Page, Item (75) Inventors, line 2, following (AT); Jose Luis Ceballos, Villach (AT), insert --; Siegfried Albel, Arriach (AT)--.

Signed and Sealed this
Fifth Day of April, 2016

Michelle K. Lee
*Director of the United States Patent and Trademark Office*